United States Patent
Park et al.

(10) Patent No.: US 9,034,765 B2
(45) Date of Patent: May 19, 2015

(54) METHODS OF FORMING A SEMICONDUCTOR DEVICE

(71) Applicant: Samsung Electronics Co., Ltd., Suwon-Si, Gyeonggi-Do (KR)

(72) Inventors: Joonsoo Park, Seongnam-si (KR); JungWoo Seo, Hwaseong-si (KR); KyoungRyul Yoon, Yongin-si (KR); Cheolhong Kim, Yongin-si (KR); Seokwoo Nam, Seongnam-si (KR); Yongjik Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/956,556

(22) Filed: Aug. 1, 2013

(65) Prior Publication Data

US 2014/0057440 A1 Feb. 27, 2014

(30) Foreign Application Priority Data

Aug. 27, 2012 (KR) ........................ 10-2012-0093854

(51) Int. Cl.
*H01L 21/311* (2006.01)
*H01L 21/302* (2006.01)

(52) U.S. Cl.
CPC .................................... *H01L 21/302* (2013.01)

(58) Field of Classification Search
USPC ........................................................ 438/702
See application file for complete search history.

(56) References Cited

U.S. PATENT DOCUMENTS

| | | | |
|---|---|---|---|
| 5,506,431 A | 4/1996 | Thomas | |
| 6,221,562 B1 * | 4/2001 | Boyd et al. | 430/314 |
| 6,484,057 B2 | 11/2002 | Ideker et al. | |
| 6,638,441 B2 * | 10/2003 | Chang et al. | 216/46 |
| 6,667,237 B1 * | 12/2003 | Metzler | 438/690 |
| 6,734,107 B2 * | 5/2004 | Lai et al. | 438/696 |
| 7,291,560 B2 * | 11/2007 | Parascandola et al. | 438/689 |
| 7,659,208 B2 | 2/2010 | Zhou et al. | |
| 7,737,039 B2 | 6/2010 | Sandhu et al. | |
| 7,897,058 B2 * | 3/2011 | Van Haren et al. | 216/41 |
| 8,227,176 B2 * | 7/2012 | Lee | 430/315 |
| 8,440,570 B2 * | 5/2013 | Kim | 438/717 |
| 8,802,551 B1 * | 8/2014 | Seo et al. | 438/597 |
| 2006/0228895 A1 * | 10/2006 | Chae et al. | 438/725 |
| 2007/0008493 A1 | 1/2007 | Kratzer | |
| 2007/0099431 A1 * | 5/2007 | Li | 438/735 |
| 2007/0237770 A1 | 10/2007 | Lai et al. | |
| 2008/0081461 A1 * | 4/2008 | Lee et al. | 438/637 |

(Continued)

FOREIGN PATENT DOCUMENTS

KR 2011-0060757 A 6/2011

*Primary Examiner* — Matthew Landau
*Assistant Examiner* — Igwe U Anya
(74) *Attorney, Agent, or Firm* — Harness, Dickey & Pierce, P.L.C.

(57) ABSTRACT

A method of forming a semiconductor device includes first preliminary holes over an etch target, the first preliminary holes arranged as a plurality of rows in a first direction, forming dielectric patterns each filling one of the first preliminary holes, sequentially forming a barrier layer and a sacrificial layer on the dielectric patterns, forming etch control patterns between the dielectric patterns, forming second preliminary holes by etching the sacrificial layer, each of the second preliminary holes being in a region defined by at least three dielectric patterns adjacent to each other, and etching the etch target layer corresponding to positions of the first and second preliminary holes to form contact holes.

20 Claims, 24 Drawing Sheets

(56) References Cited

U.S. PATENT DOCUMENTS

| | | |
|---|---|---|
| 2008/0261075 A1 | 10/2008 | Seo et al. |
| 2009/0017631 A1 | 1/2009 | Bencher |
| 2009/0068838 A1* | 3/2009 | Kim et al. .................. 438/692 |
| 2009/0298276 A1* | 12/2009 | Lee et al. .................. 438/597 |
| 2009/0317748 A1 | 12/2009 | Choi |
| 2010/0120258 A1 | 5/2010 | Kim |
| 2010/0136792 A1 | 6/2010 | Mebarki et al. |
| 2011/0107815 A1* | 5/2011 | Nelson et al. .............. 73/23.33 |
| 2011/0124196 A1 | 5/2011 | Lee |
| 2011/0177691 A1 | 7/2011 | Kang |
| 2011/0201017 A1 | 8/2011 | Greenfield et al. |
| 2011/0256723 A1 | 10/2011 | Lee et al. |
| 2013/0337652 A1* | 12/2013 | Sun et al. .................. 438/703 |

* cited by examiner

METHODS OF FORMING A SEMICONDUCTOR DEVICE

CROSS-REFERENCE TO RELATED APPLICATIONS

This U.S. non-provisional patent application claims the benefit of priority under 35 U.S.C. §119 to Korean Patent Application No. 10-2012-0093854, filed on Aug. 27, 2012, the entire contents of which are incorporated by reference herein.

BACKGROUND

1. Field

Some example embodiments relate to methods of forming a semiconductor device and, more particularly, to methods of forming a semiconductor device including a hole.

2. Description of the Related Art

Semiconductor devices have been highly integrated in order to satisfy consumer demands such as improved performance and low manufacturing costs. The integration degree of semiconductor devices is one of several important factors in determining the cost of semiconductor devices. However, there may be limitations in improving the process technology for forming fine patterns. In addition, high cost equipment or apparatuses may be required to form the fine patterns.

Various research has been conducted on manufacturing techniques for forming highly integrated semiconductor devices without the high cost equipment or apparatuses.

SUMMARY

Some example embodiments provide methods of forming a highly integrated semiconductor device.

According to an example embodiment, a method of forming a semiconductor device includes, forming first preliminary holes over an etch target, the first preliminary holes arranged as a plurality of rows in a first direction; forming dielectric patterns each filling one of the first preliminary holes; sequentially forming a barrier layer and a sacrificial layer on the dielectric patterns; forming etch control patterns between the dielectric patterns; forming second preliminary holes by etching the sacrificial layer, each of the second preliminary holes being in a region defined by at least three dielectric patterns adjacent to each other; and etching portions of the etch target layer corresponding to positions of the first and second preliminary holes to form contact holes.

The forming first preliminary holes may include arranging the first preliminary holes as a plurality of columns in a second direction, the second direction being perpendicular to the first direction, and arranging the first preliminary holes in each of the columns in a zigzag pattern in the second direction.

The forming second preliminary holes may include forming each of the second preliminary holes in a region defined by the at least three dielectric patterns and at least three etch control patterns between the at least three dielectric patterns.

The forming first preliminary holes may include arranging the first preliminary holes as a plurality of columns in a second direction, the second direction being perpendicular to the first direction, and arranging the first preliminary holes in each of the columns in a line.

The forming the second preliminary holes may include forming each of the second preliminary holes in a region defined by at least four dielectric patterns adjacent to each other and at least four etch control patterns between the at least four dielectric patterns.

The forming first preliminary holes may include sequentially forming an etch stop layer and a mask layer on the etch target layer, and patterning the mask layer and the etch stop layer so as to expose the etch target layer.

The forming dielectric patterns may include forming a dielectric layer filling the first preliminary holes; planarizing the dielectric layer to form the dielectric patterns spaced apart from each other; and removing the mask layer.

The sequentially forming a barrier layer and the sacrificial layer may include forming the sacrificial layer such that an empty space is between the at least three dielectric patterns adjacent to each other.

The forming etch control patterns may include conformally forming an etch control layer on the sacrificial layer, and partially removing the etch control layer such that a portion of the etch control layer remains between the at least three dielectric patterns.

The method may further include selectively removing the sacrificial layer, the barrier layer, the etch control patterns, an exposed portion of the etch stop layer, and the dielectric patterns, after the forming second preliminary holes. The selectively removing of the etch control patterns and the exposed portion of the etch stop layer may be performed simultaneously.

The forming second preliminary holes may include etching the sacrificial layer such that a portion of the sacrificial layer between the barrier layer and the etch control patterns remains between the at least three dielectric patterns.

The forming second preliminary holes may include forming the second preliminary holes each having a size and a position defined by the at least three dielectric patterns and at least three etch control patterns between the at least three dielectric patterns.

The forming a barrier layer and the forming etch control patterns may include forming the barrier layer and the etch control patterns, respectively, of a material having an etch selectivity with respect to the sacrificial layer.

The forming etch control patterns may include forming the etch control patterns of a material having an etch selectivity with respect to the barrier layer.

The etch control patterns may be formed of a same material as the etch stop layer.

The forming etch control patterns may include using silicon nitride.

According to another example embodiment, a method of forming a semiconductor device includes forming first preliminary holes over an etch target, the first preliminary holes arranged as a plurality of rows in a first direction, forming dielectric patterns each filling one of the first preliminary holes, sequentially forming a barrier layer and a sacrificial layer on the dielectric patterns, forming second preliminary holes by etching the sacrificial layer, each of the second preliminary holes being in a region defined by at least three dielectric patterns adjacent to each other, and selectively etching portions of the etch target layer corresponding to positions of the first preliminary holes and the second preliminary holes to form first contact holes and second contact holes, respectively. A distance between the second contact holes adjacent to each other is less than a distance between the first contact holes adjacent to each other.

The method may further include forming etch control patterns between the dielectric patterns, the second preliminary holes each having a size and position determined by at least one of the etch control patterns, and at least one of the sacrificial layer and the etch control patterns having an etch selectivity with respect to the barrier layer.

According to a further example embodiment, a method of forming a semiconductor device includes forming first preliminary holes over an etch target, the first preliminary holes arranged as a plurality of rows in a first direction, forming dielectric patterns each filling one of the first preliminary holes, sequentially forming a barrier layer and a sacrificial layer on the dielectric patterns, forming etch control patterns between the dielectric patterns, at least one of the sacrificial layer and the etch control patterns having an etch selectivity with respect to the barrier layer, forming second preliminary holes by etching the sacrificial layer, the second preliminary holes each having a size and position determined by at least one of the etch control patterns, and etching portions of the etch target layer corresponding to positions of the first and second preliminary holes to form contact holes.

BRIEF DESCRIPTION OF THE DRAWINGS

Example embodiments will become more apparent in view of the attached drawings and accompanying detailed description.

FIGS. 1A through 10A are plan views illustrating a method of forming a semiconductor device according to an example embodiment;

FIGS. 1B through 10B are cross-sectional views taken along lines I-I' of FIGS. 1A to 10A, respectively;

FIGS. 1C through 10C are cross-sectional views taken along lines II-II' of FIGS. 1A to 10A, respectively;

DETAILED DESCRIPTION OF EXAMPLE EMBODIMENTS

Figure 1A:
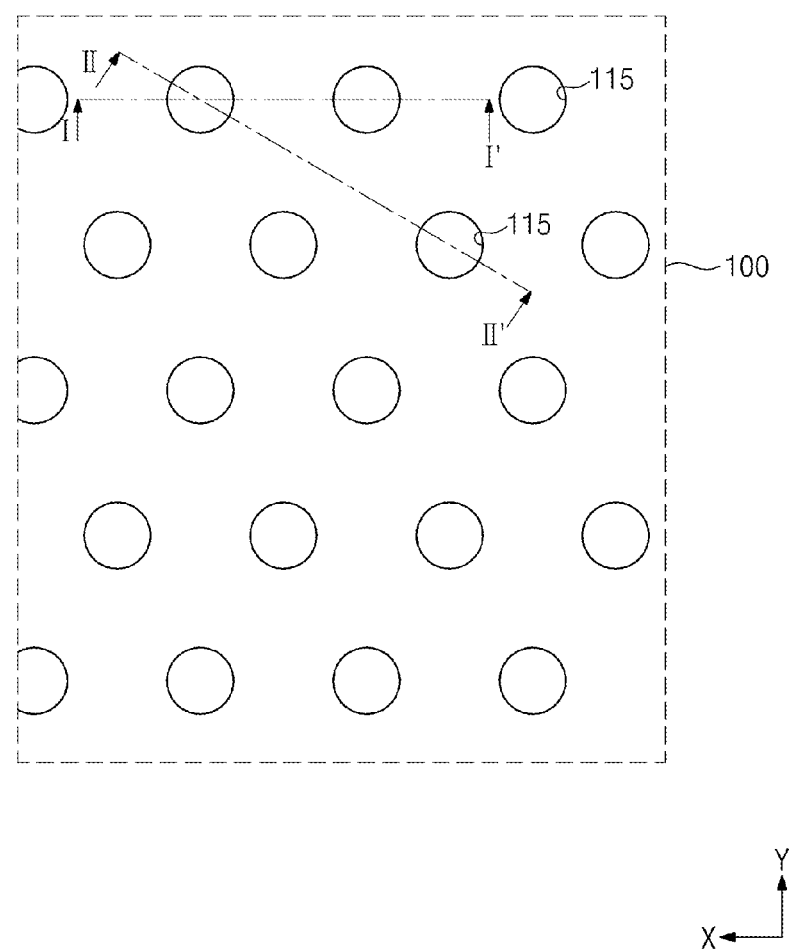

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 10A are plan views illustrating a method of forming a semiconductor device according to an example embodiment. FIGS. 1B through 10B are cross-sectional views taken along lines I-I' of FIGS. 1A through 10A, respectively. FIGS. 1C through 10C are cross-sectional views taken along lines II-II' of FIGS. 1A through 10A, respectively.

Referring to FIG. 1A, first preliminary holes 115 are formed on an etch target layer 100. The etch target layer 100 may be a semiconductor substrate (e.g., a silicon or germanium substrate). Alternatively, the etch target layer 100 may be an oxide layer including a semiconductor material. For example, the etch target layer 100 may be a silicon oxide layer. A substrate (not shown) may be disposed under the etch target layer 100.

The first preliminary holes 115 may constitute a plurality of rows in a first direction. The first preliminary holes 115 may constitute a plurality of columns in a second direction perpendicular to the first direction. In some example embodiments, the first preliminary holes 115 constituting each of the columns may be arranged in a zigzag pattern along the second direction. The first direction may correspond to an x-axis direction of FIG. 1A, and the second direction may correspond to a y-axis direction of FIG. 1A. For example, the first preliminary holes 115 constituting odd-numbered rows may not overlap with the first preliminary holes 115 constituting even-numbered rows in the second direction.

The first preliminary holes 115 constituting the odd-numbered rows may constitute first sub-columns in the second direction. The first preliminary holes 115 constituting the even-numbered rows may constitute second sub-columns in the second direction. The first preliminary holes 115 constituting each of the first sub-columns may be arranged in a line, and the first preliminary holes 115 constituting each of the second sub-columns may also be arranged in a line. The first sub-columns and the second sub-columns may be alternately arranged in the first direction. The first and second sub-columns adjacent to each other may constitute each of the columns.

Figure 1B:
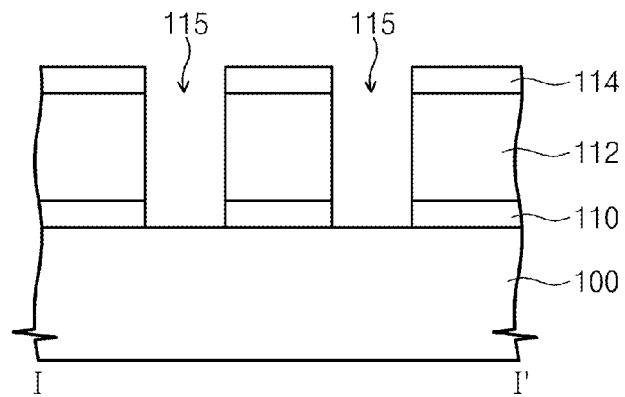
Figure 1C:
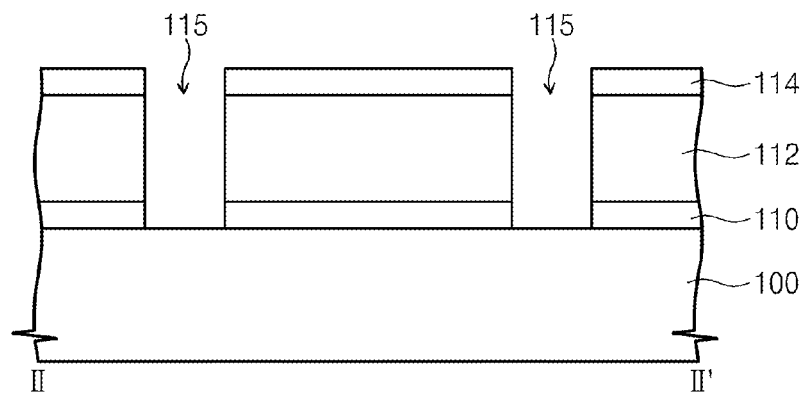

Referring to FIGS. 1B and 1C, a method of forming the first preliminary holes 115 will be described in more detail. An etch stop layer 110 and a mask layer 112 may be sequentially formed on the etch target layer 100. The mask layer 112 and the etch stop layer 110 may be patterned to form the first preliminary holes 115. The mask layer 112 may be anisotropically etched during the patterning process. For example, the etch stop layer 110 may include a silicon nitride layer. The mask layer 112 may be a spin-on hard mask (SOH) layer. Before the first preliminary holes 115 are formed, a silicon oxynitride layer 114 may further be formed on the mask layer 112. In this case, the first preliminary hole 115 may extend through (or, alternatively, penetrate) the silicon oxynitride layer 114, the mask layer 112, and the etch stop layer 110. In another example embodiment, the silicon oxynitride layer 114 may be omitted. As a result, the first preliminary holes 115 may be formed to expose the etch target layer 100.

Figure 2A:
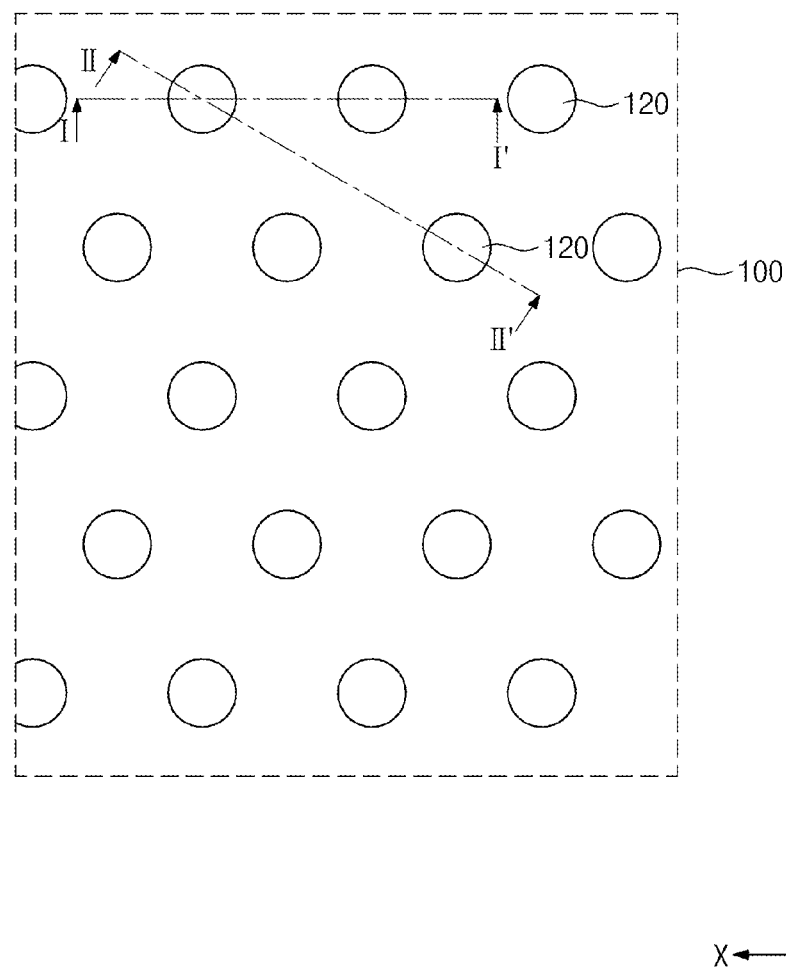
Figure 2B:
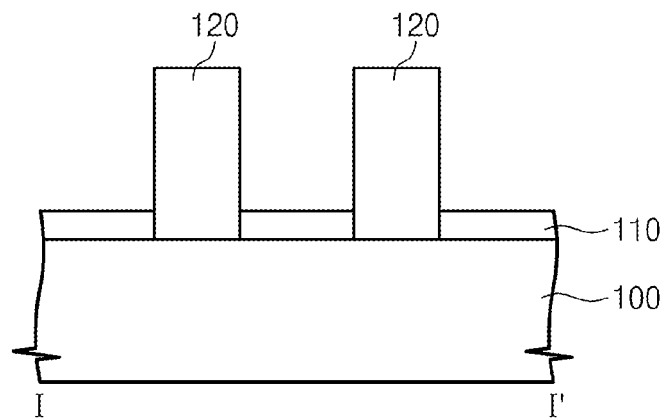
Figure 2C:
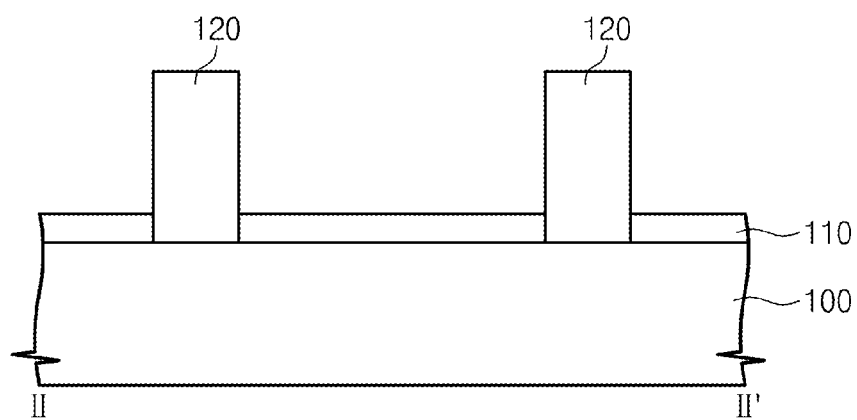

Referring to FIGS. 2A, 2B, and 2C, dielectric patterns 120 may be formed to fill the first preliminary holes 115, respectively. A dielectric layer may be deposited to fill the first preliminary holes 115 and the deposited dielectric layer may be planarized to form the dielectric patterns 120. Subsequently, the silicon oxynitride layer 114 and the mask layer 112 may be removed as shown in FIGS. 2B and 2C. Thus, the dielectric patterns 120 may be formed to have protruding shapes on the etch target layer 100. The dielectric patterns 120 may protrude to be higher than a top surface of the etch stop layer 110. The dielectric patterns 120 may include an oxide including a semiconductor material. For example, the dielectric pattern 120 may include silicon oxide.

The etch stop layer 110 may remain to protect a top surface of the etch target layer 100. Because the dielectric patterns 120 are formed in the first preliminary holes 115, the dielectric patterns 120 may constitute a plurality of rows in the first direction and may constitute a plurality of columns in the second direction. The dielectric patterns 120 constituting each of the columns may be arranged in a zigzag in the second direction.

Figure 3A:
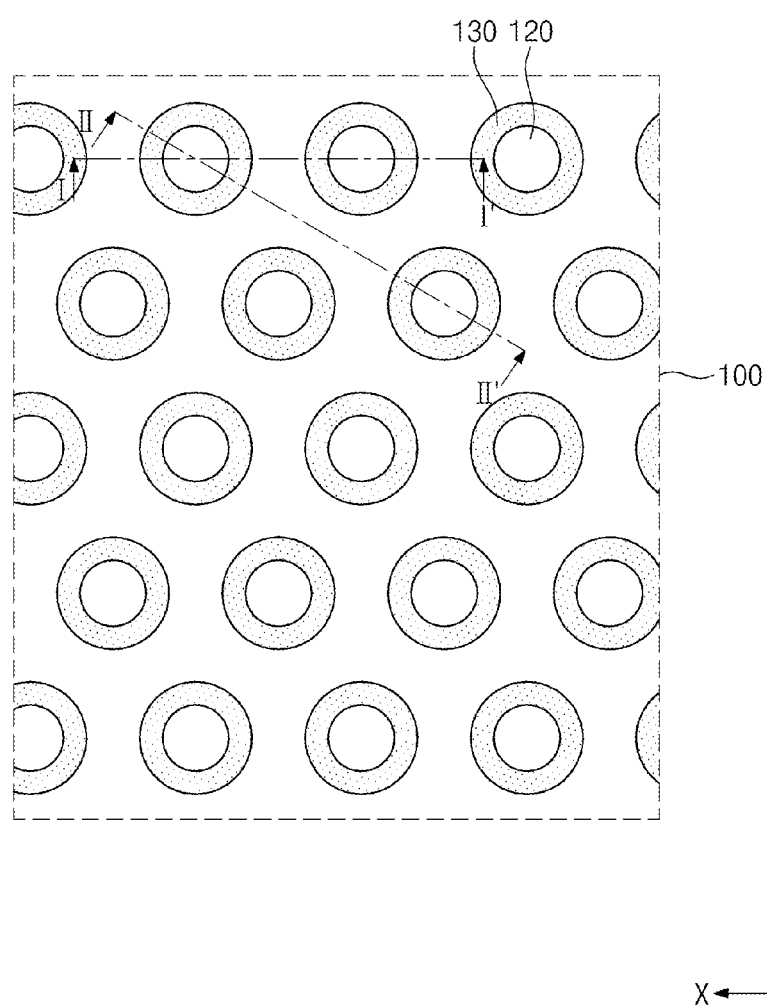
Figure 3B:
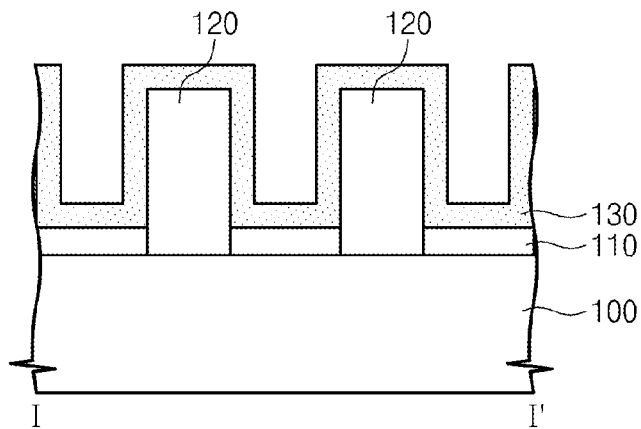
Figure 3C:
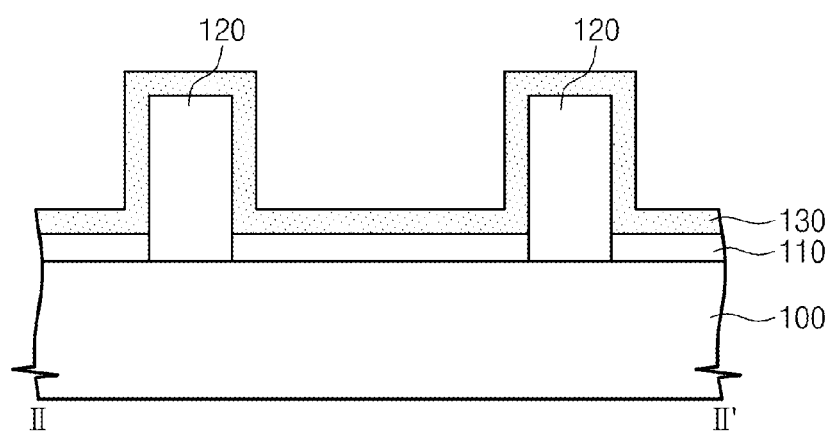

Referring to FIGS. 3A, 3B, and 3C, a barrier layer 130 may be formed on the etch target layer 100. The barrier layer 130 may be formed to conformally cover the dielectric patterns 120 protruding from the top surface of the etch target layer 100. In other words, the barrier layer 130 may be formed along exposed top surfaces and sidewalls of the dielectric patterns 120 and may be formed to have a substantially constant (or, alternatively, conformal) thickness on the etch stop layer 110 between the dielectric patterns 120. A thickness of the barrier layer 130 may control the size of second preliminary holes (116, 116a, and 116b shown in FIGS. 7A and 7C) formed in a subsequent process. The barrier layer 130 may include a semiconductor material. For example, the barrier layer 130 may include polysilicon.

Figure 4A:
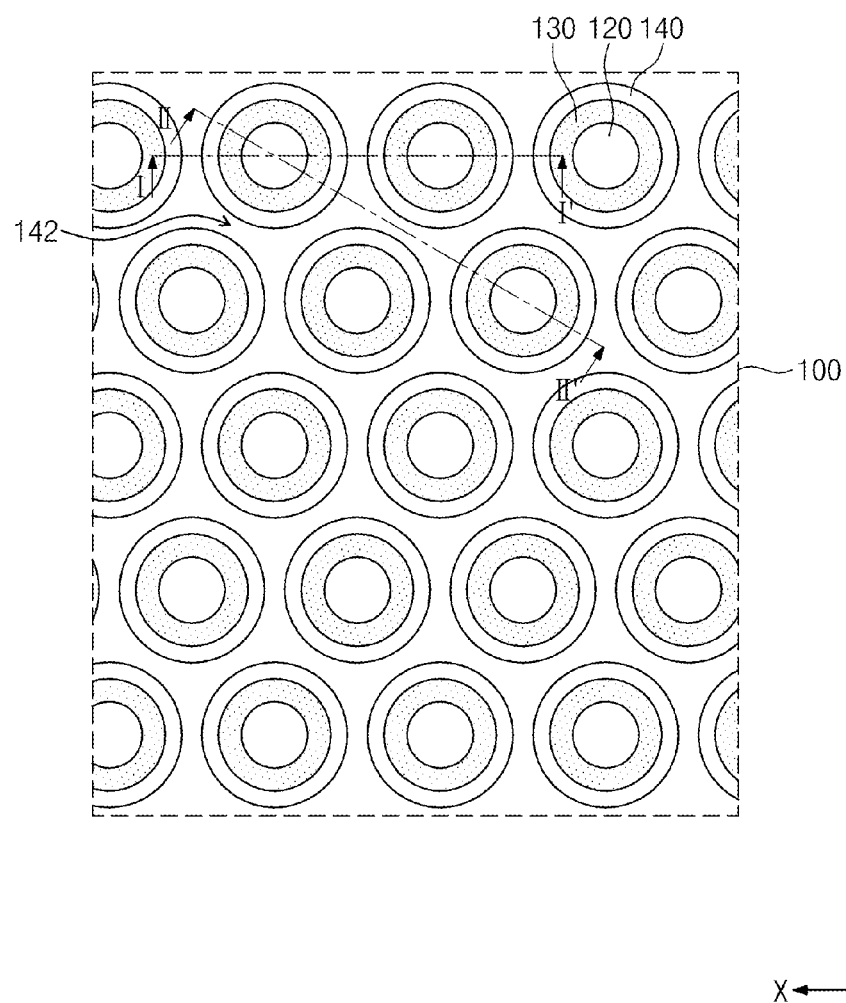
Figure 4B:
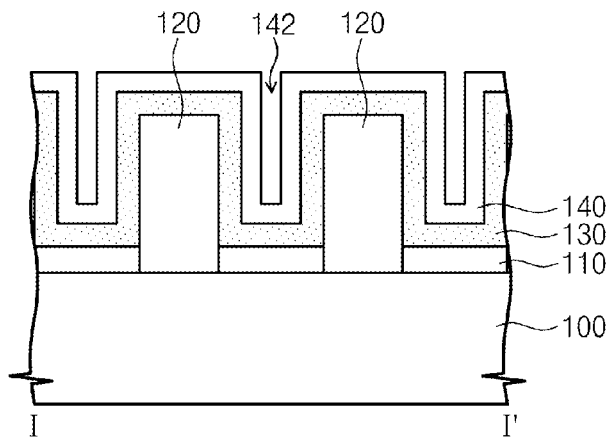
Figure 4C:
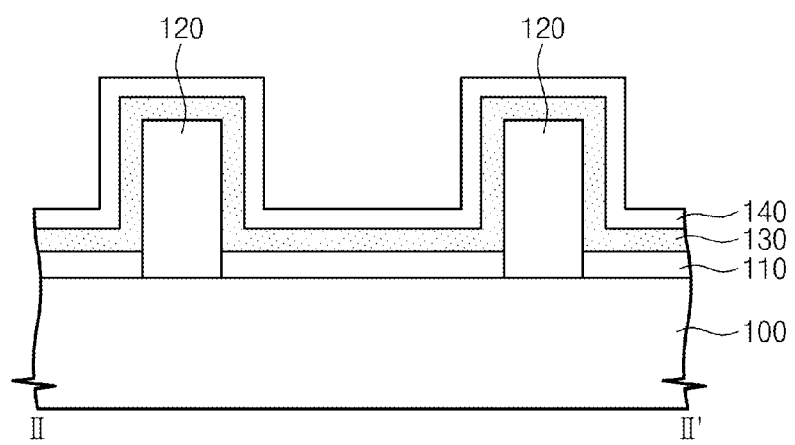

Referring to FIGS. 4A, 4B, and 4C, a sacrificial layer 140 may be formed on the barrier layer 130. The sacrificial layer 140 may be conformally formed on the etch target layer 100 having the barrier layer 130. In an example embodiment, the sacrificial layer 140 may be conformally formed along surfaces of the dielectric patterns 120 protruding from the etch target layer 100 and may define an empty space 142 between dielectric patterns 120. For example, as illustrated in FIG. 4B, the barrier layer 130 and the sacrificial layer 140 may be formed between the dielectric patterns 120 adjacent to each other in the first direction, and a thickness of the sacrificial layer 140 may be controlled in order to form the empty space 142 between the adjacent dielectric patterns 140 in the first direction. Likewise, as illustrated in FIG. 4A, the thickness of the sacrificial layer 140 may be controlled to form the empty space 142 between the dielectric pattern 120 of the odd-numbered row and the dielectric pattern 120 of the even-numbered row adjacent to the odd-numbered row. A width of the empty space 142 may be, for example, several tens A. The sacrificial layer 140 may be formed of a material having an etch selectivity with respect to the barrier layer 130. The sacrificial layer 140 may include an oxide including a semiconductor material. For example, the sacrificial layer 140 may include silicon oxide.

In other example embodiments, the sacrificial layer 140 may be anisotropically etched to form sacrificial patterns on the sidewalls of the dielectric patterns 120, respectively. In this case, the sacrificial pattern may have a spacer shape disposed on the sidewall of the dielectric pattern 120. The barrier layer 130 may be disposed between the sacrificial pattern and the sidewall of the dielectric pattern 120. After the sacrificial patterns are formed, subsequent processes may be performed.

Figure 5A:
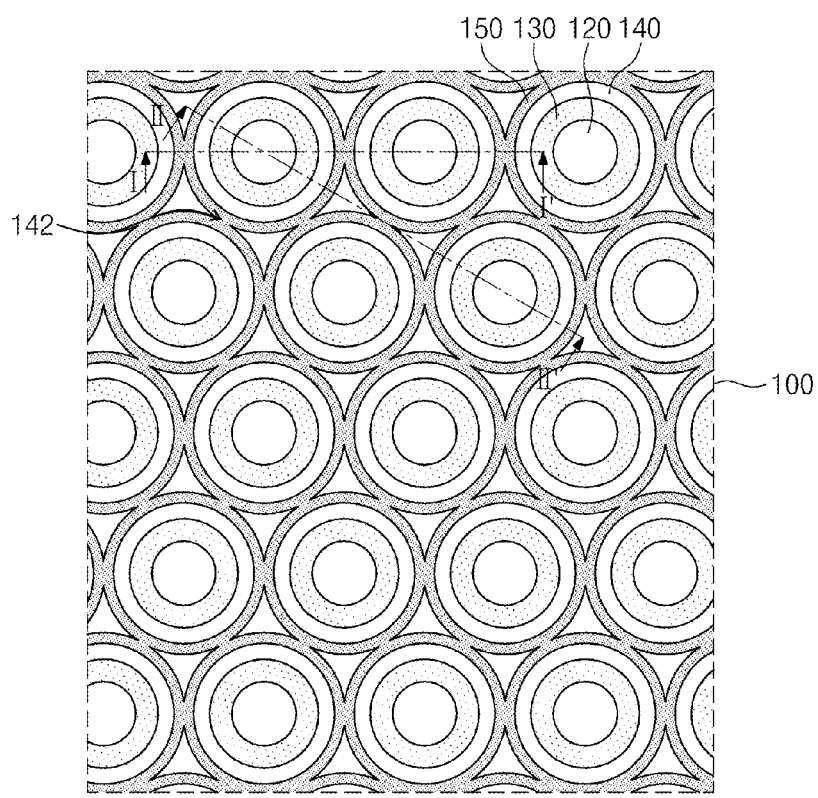
Figure 5B:
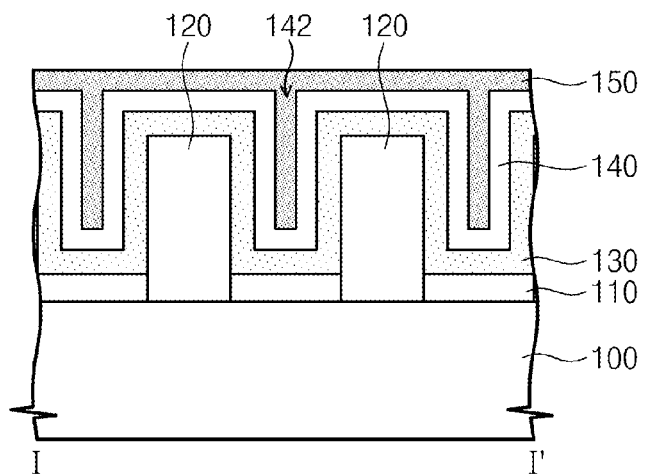
Figure 5C:
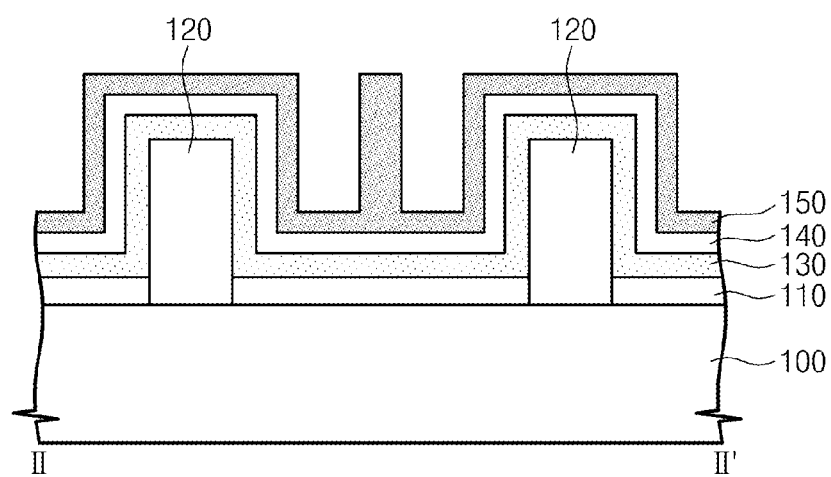

Referring to FIGS. 5A, 5B, and 5C, an etch control layer 150 may be formed on the on the sacrificial layer 140. The etch control layer 150 may be conformally formed on the etch target layer 100 having the sacrificial layer 140. In an example embodiment, the etch control layer 150 may fill the empty space 142 between the dielectric patterns 120 adjacent to each other. As illustrated in FIG. 5B, the etch control layer 150 may completely fill the empty space 142 between the dielectric patterns 120 adjacent to each other in the first direction.

Likewise, as illustrated in FIG. 5A, the etch control layer 150 may fill the empty space 142 between the dielectric pattern 120 of the odd-numbered row and the dielectric pattern 120 of the even-numbered row adjacent thereto. The etch control layer 150 may include a material having an etch selectivity with respect to the sacrificial layer 140. For example, the etch control layer 150 may include silicon nitride. In an example embodiment, the etch control layer 150 may include a material having an etch selectivity with respect to the barrier layer 130. In another example embodiment, the etch control layer 150 may include a material having an etch selectivity with respect to the etch stop layer 110.

Figure 6A:
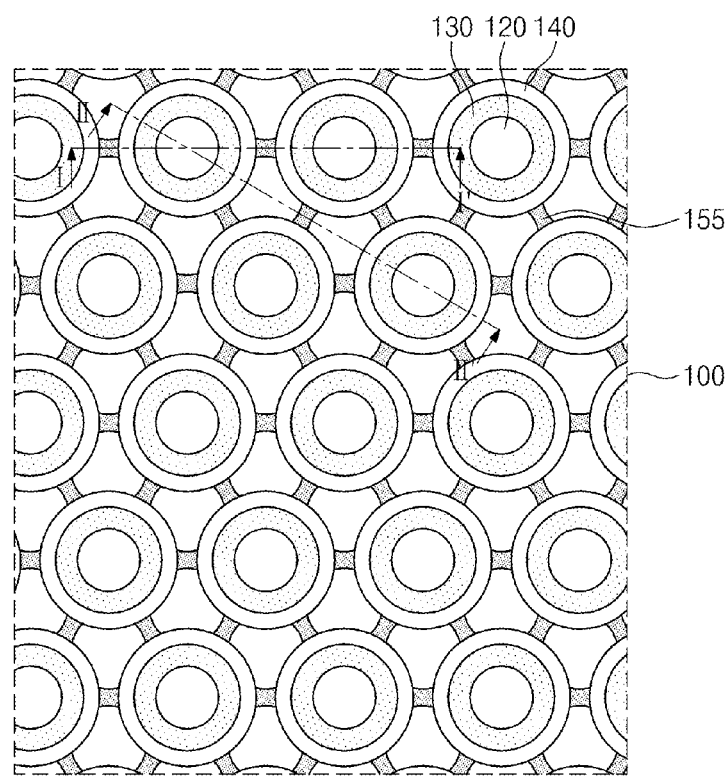
Figure 6A:
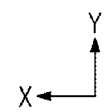
Figure 6B:
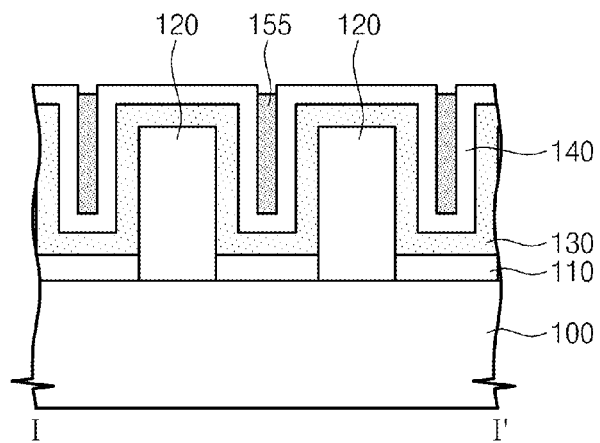
Figure 6C:
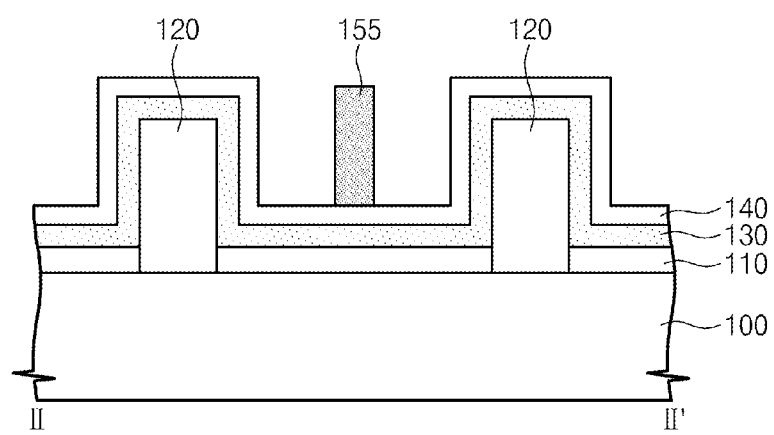

Referring to FIGS. 6A, 6B, and 6C, the etch control layer 150 of FIG. 5A may be partially removed to form etch control patterns 155. In an example embodiment, an etch-back process may be performed on the etch control layer 150 until the sacrificial layer 140 on the top surface of the dielectric pattern 120 is exposed. In this case, the etch control layer 150 in the empty space 142 between the dielectric patterns 120 adjacent to each other may remain to form the etch control patterns 155 between the dielectric patterns 120.

In more detail, as illustrated in FIG. 6B, the etch control patterns 155 may be formed in the empty spaces 142 of FIG. 5B between the dielectric patterns 120 arranged in the first direction. In an example embodiment, top surfaces of the etch control patterns 155 may be lower than a top surface of the sacrificial layer 130 disposed on the top surface of the dielectric pattern 120. Likewise, as illustrated in FIG. 6A, the etch control patterns 155 may be formed between the dielectric patterns 120 of the odd-numbered row and the dielectric patterns 120 of the even-numbered row adjacent thereto, respectively.

The etch control patterns 155 are disposed between the dielectric patterns 120 adjacent to each other, respectively. Thus, the etch control patterns 155 may control positions and sizes of second holes in order that the second preliminary holes will be formed at desired positions in a subsequent process.

Figure 7A:
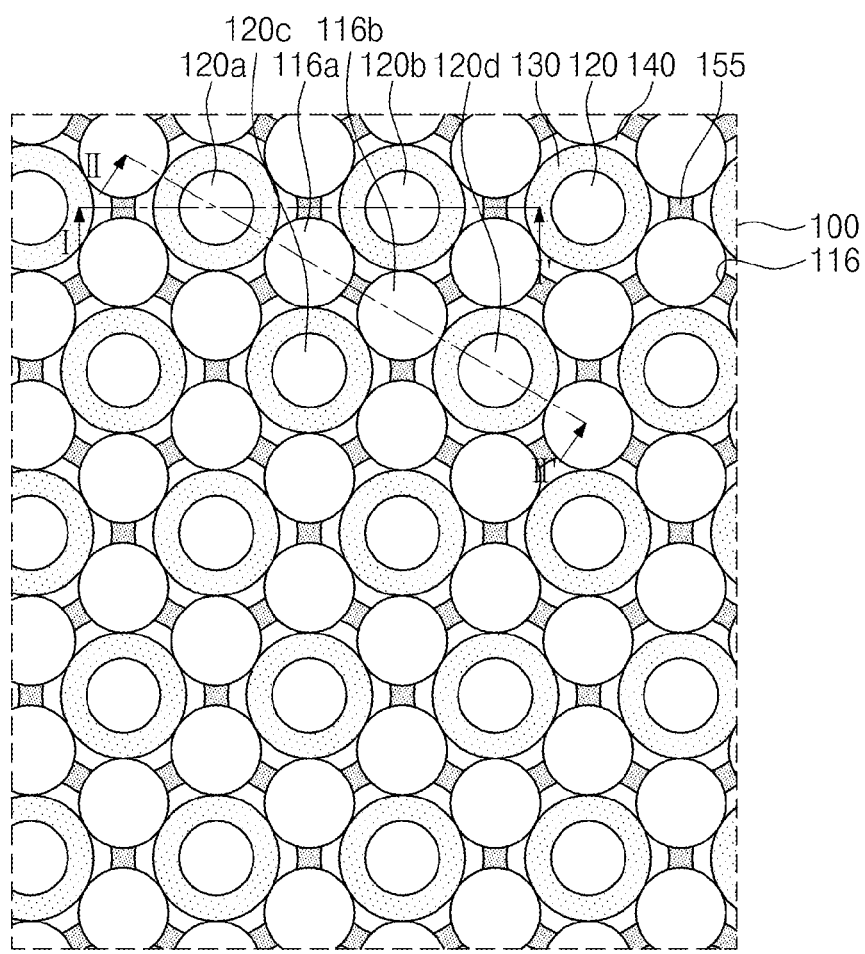
Figure 7B:
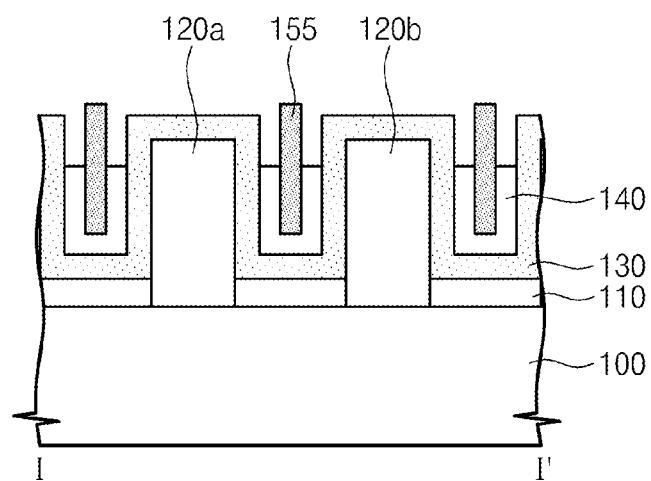
Figure 7C:
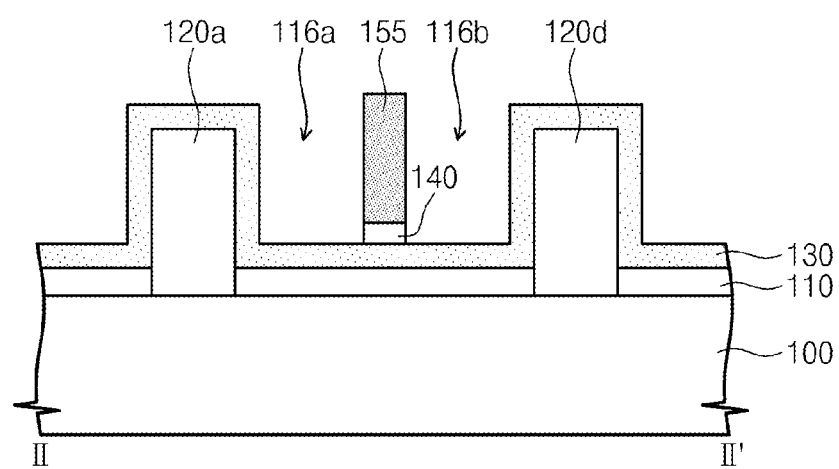

Referring to FIGS. 7A, 7B, and 7C, the sacrificial layer 140 may be partially etched to form second preliminary holes 116 (116a and 116b). The second preliminary holes 116 may be formed in spaces between the dielectric patterns 120 (120a, 120b, 120c, and 120d), respectively. Each of the second preliminary holes 116 may be formed in a region which is defined by the dielectric patterns 120 and the etch control patterns 155 adjacent to each other. In an example embodiment, each of the second preliminary holes 116 may be formed in a region which is defined by three dielectric patterns 120 and three etch control patterns adjacent to each other.

As illustrated in FIG. 7A, the second preliminary hole 116a may be formed in a space surrounded by two dielectric patterns 120a and 120b of a first row and one dielectric pattern 120c of a second row adjacent to the two dielectric patterns 120a and 120b. Additionally, the second preliminary hole 116a may further be defined by three etch control patterns 155 adjacent to each other. Thus, a size and a position of the second preliminary hole 116a may be controlled by the three etch control patterns 155 adjacent to each other. Also, the second preliminary hole 116b may be formed in a space surrounded by the dielectric pattern 120b of the first row and two dielectric patterns 120c and 120d of the second row adjacent to the dielectric pattern 120b. Additionally, the second preliminary hole 116b may be defined by three etch control patterns 155 adjacent to each other and disposed between the dielectric patterns 120b, 120c, and 120d. A size and a position of the second preliminary hole 116b may be controlled by the three etch control patterns 155 disposed between the dielectric patterns 120b, 120c, and 120d.

Forming the second preliminary holes 116 may include anisotropically etching the sacrificial layer 140. In this case, because the barrier layer 130 and the etch control patterns 155 have the etch selectivity with respect to the sacrificial layer 140, the barrier layer 130 and the etch control patterns 155 may remain to control the size of the second preliminary holes 116. In other words, the second preliminary holes 116 may be formed by etching the sacrificial layer 140 and may be formed in a space defined by the barrier layer 130 and the etch control patterns 155 adjacent to each other. Referring to FIG. 7B, the sacrificial layer 140 between the dielectric patterns 120a and 120b adjacent to each other may not be completely removed and may partially remain. In other words, a portion of the sacrificial layer 140 may remain between the barrier layer 130 and the etch control pattern 155 because the barrier layer 130 and the etch control pattern 155 have the etch selectivity with respect to the sacrificial layer 140. Because the etch control pattern 155 is disposed between the dielectric patterns 120 adjacent to each other, the etch control pattern 155 may prevent or inhibit undesired etching of the sacrificial layer 140 in a region which is defined between the dielectric patterns 120 and the etch control pattern 155 disposed therein. As a result, the second preliminary holes 116 may be formed in the desired region (i.e., the region defined by the three dielectric patterns and the three etch control patterns 155 adjacent to each other) by the etch control patterns 155.

Thus, a plurality of the second preliminary holes 116 may be formed between the dielectric patterns 120. For example, the second preliminary holes 116 constituting two rows may be formed between the dielectric patterns 120 of the odd-numbered row and the dielectric patterns 120 of the even-numbered row adjacent thereto.

Figure 8A:
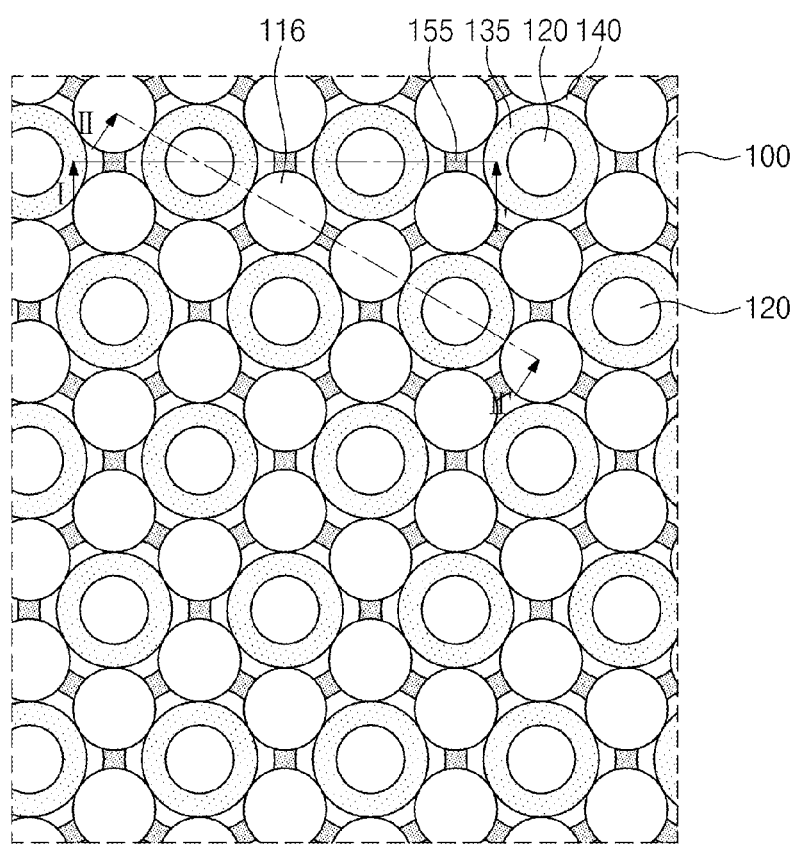
Figure 8B:
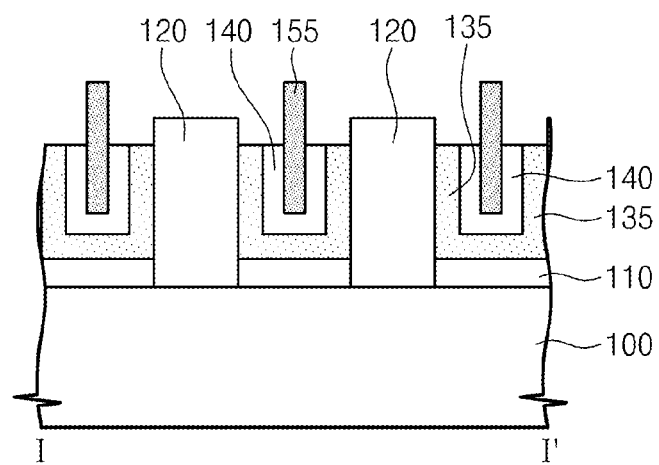
Figure 8C:
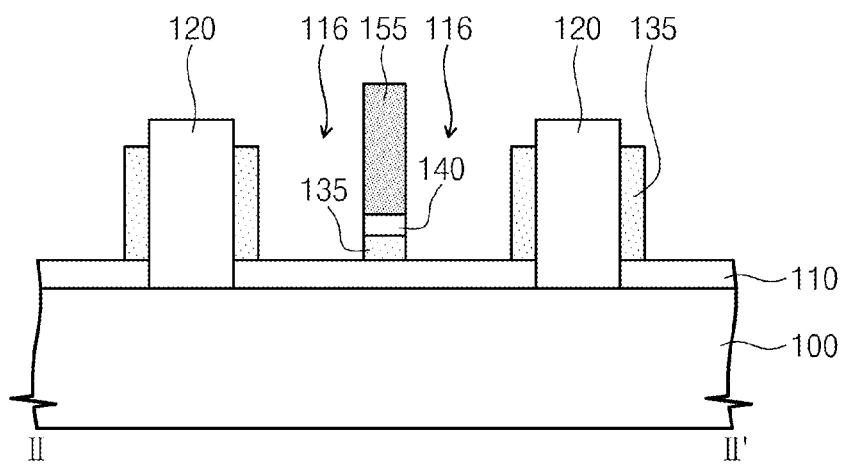

Referring to FIGS. 8A 8B, and 8C, the barrier layer 130 may be anisotropically etched to expose the top surfaces of the dielectric patterns 120. In this process, portions of the barrier layer 130 may be removed, but portions of the barrier layer 130 disposed on the sidewalls of the dielectric patterns 120 and under the etch control patterns 155 may remain to form a barrier pattern 135. As illustrated in FIG. 8C, the barrier pattern 135 is formed to expose the etch stop layer 110. If the etch control patterns 155 include a material having an etch selectivity with respect to the barrier layer 130, the etch control patterns 155 may remain as illustrated in FIGS. 8A to 8C.

Figure 9A:
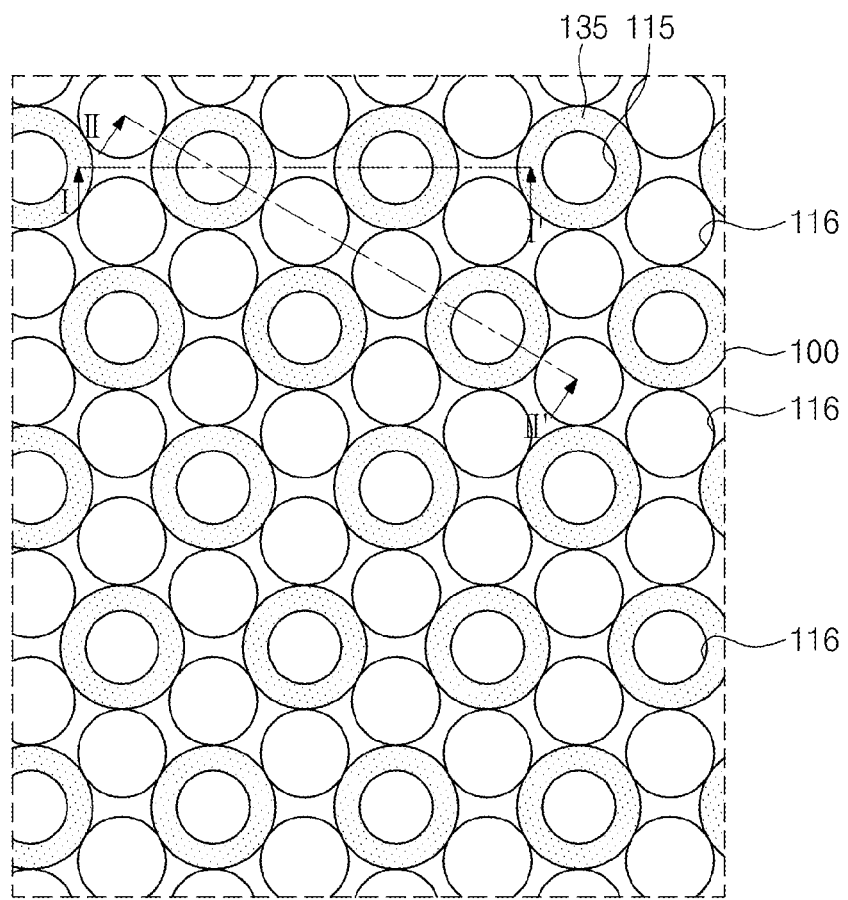
Figure 9B:
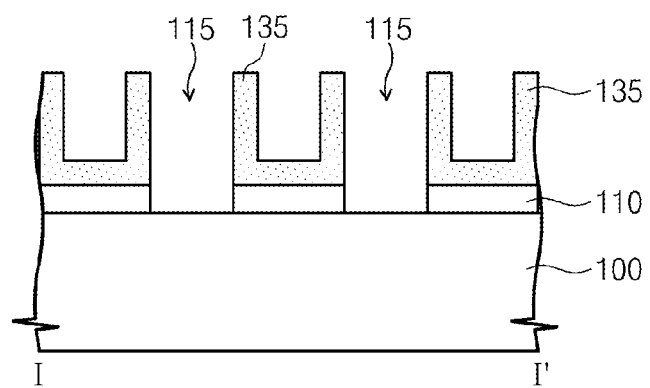
Figure 9C:
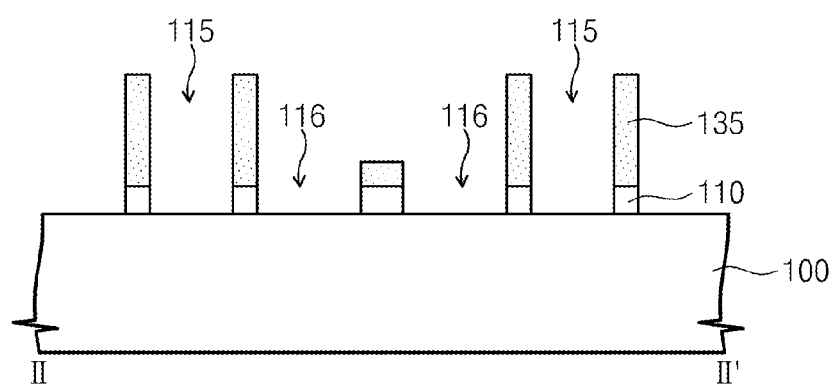

Referring to FIGS. 9A 9B, and 9C, the etch control patterns 155 may be selectively removed. The exposed etch stop layer 110 may be removed to expose the etch target layer 110. Removing the etch control patterns 155 may include etching the etch control patterns 155 by using the etch selectivity between the barrier pattern 135 and the etch control pattern 155. In an example embodiment, if the etch control patterns 155 and the etch stop layer 110 are formed of the same material, the etch control patterns 155 and the etch stop layer 110 may be etched at the same time. Thereafter, the dielectric patterns 120 may be selectively removed to form first preliminary holes 115 and second preliminary holes 116 exposing the etch target layer 100. The barrier patterns 135 may function as mask patterns to control positions of the first and second preliminary holes 115 and 116.

Figure 10A:
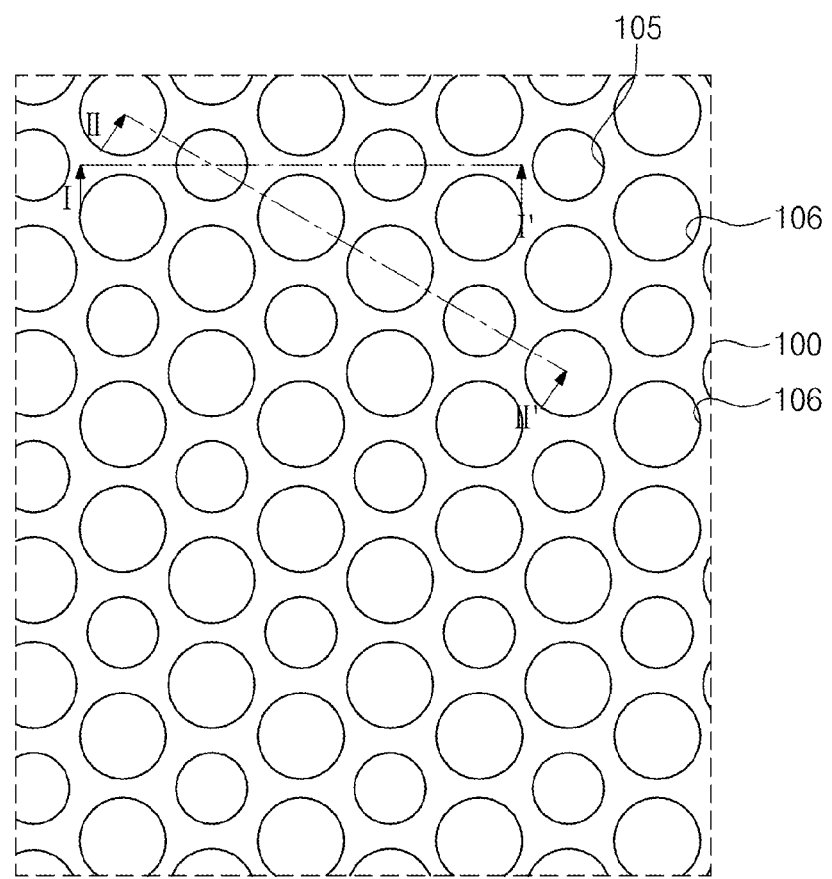
Figure 10A:
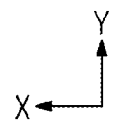
Figure 10B:
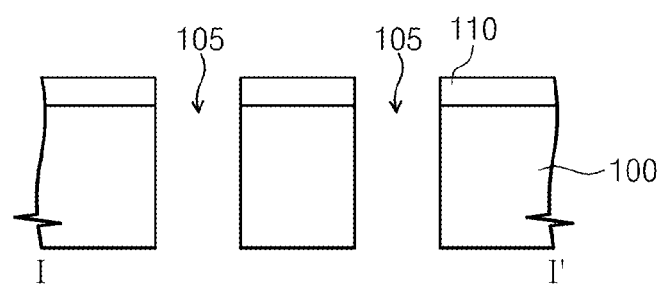
Figure 10C:
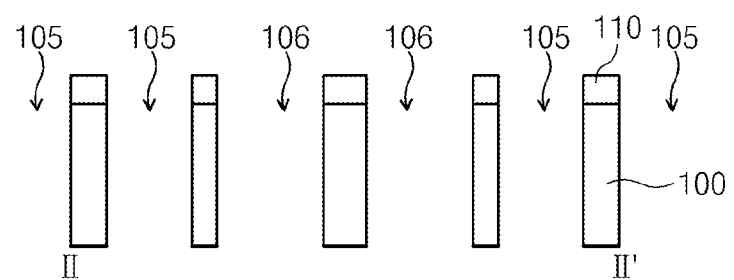

Referring to FIGS. 10A, 10B, and 10C, the barrier patterns 135 may be removed and first and second contact holes 105 and 106 may be formed in the etch target layer 100. The etch target layer 100 exposed by the first and second preliminary holes 115 and 116 of FIG. 9A may be anisotropically etched to form the first and second contact holes 105 and 106. Thus, the second contact holes 106 may be formed in the etch target layer 100 along with the first contact holes 105 defined by a selective etching process (e.g., a patterning process), and a distance between the second contact holes 106 may be narrower than a distance between the first contact holes 105 realized by the selective etching process. As a result, an integration degree of the semiconductor device may be improved.

Figure 11A:
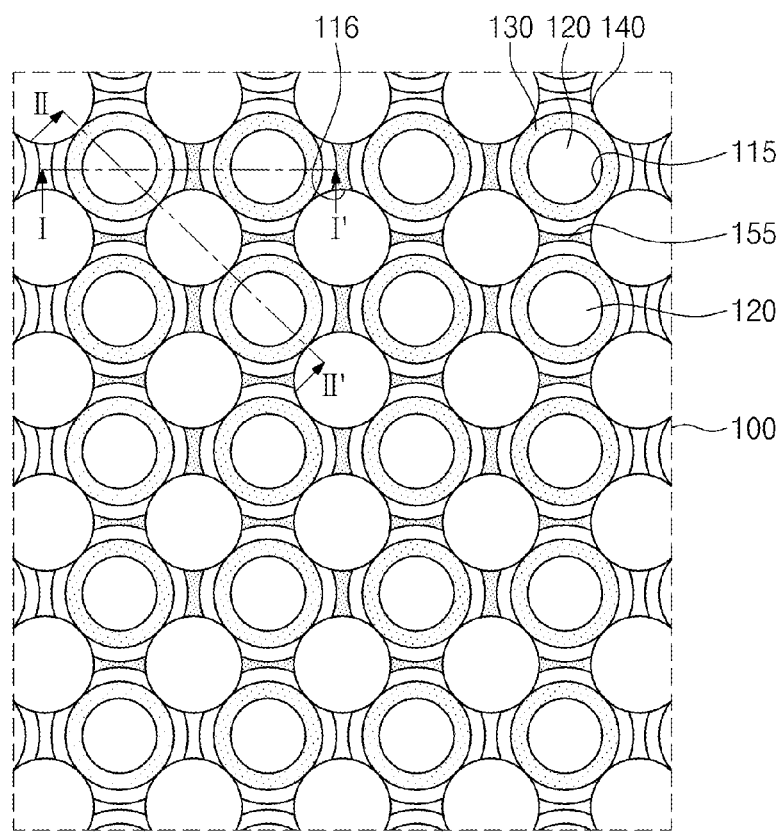
FIGS. 11A and 12A are plan views illustrating a method of forming a semiconductor device according to another example embodiment.
Figure 11B:
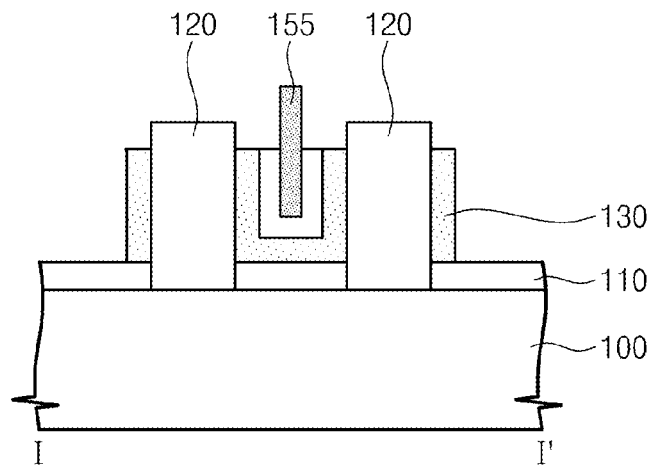
FIGS. 11B and 12B are cross-sectional views taken along lines I-I' of FIGS. 11A and 12A, respectively.
Figure 11C:
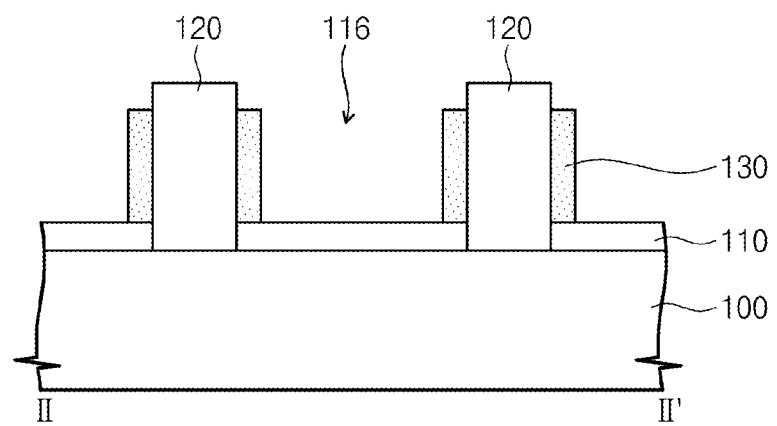
FIGS. 11C and 12C are cross-sectional views taken along lines II-II' of FIGS. 11A and 12A, respectively.
Figure 12A:
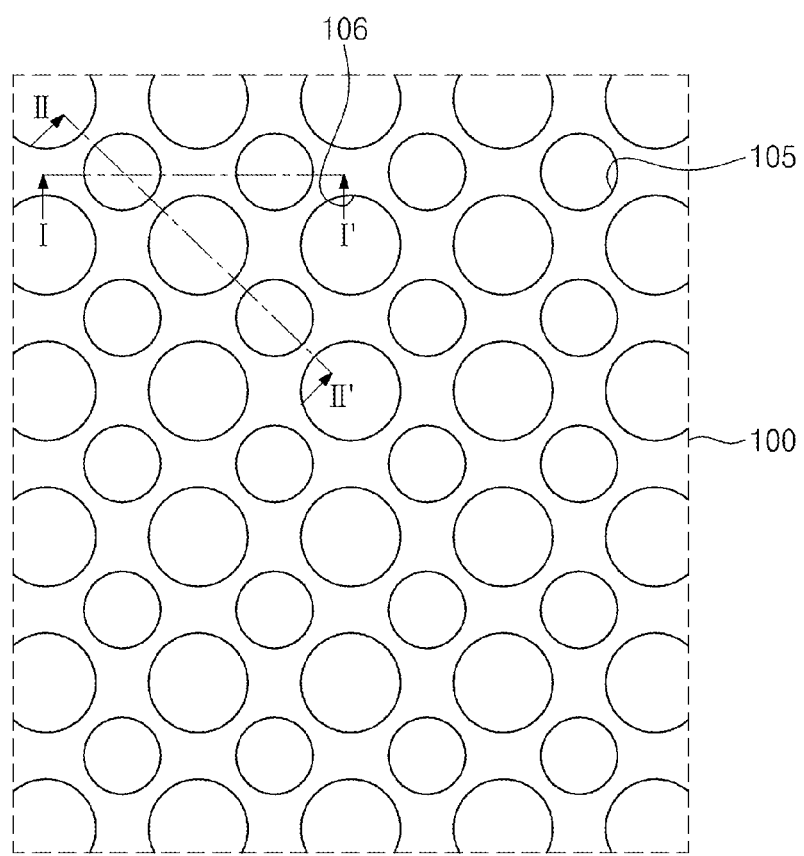
Figure 12A:
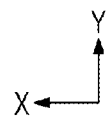
Figure 12B:
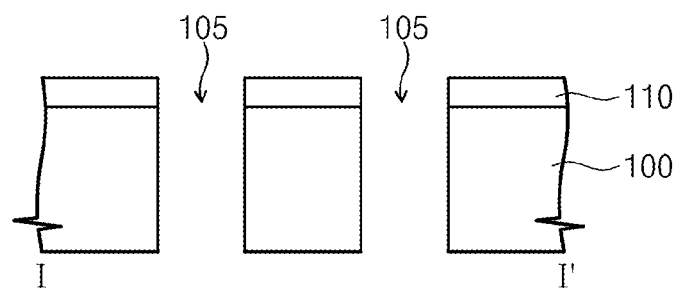
Figure 12C:
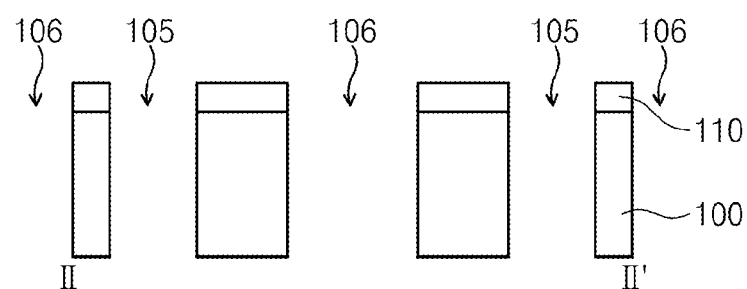

FIGS. 11A and 12A are plan views illustrating a method of forming a semiconductor device according to another example embodiment. FIGS. 11B and 12B are cross-sectional views taken along lines I-I' of FIGS. 11A and 12A, respectively. FIGS. 11C and 12C are cross-sectional views taken along lines II-II' of FIGS. 11A and 12A, respectively.

In the present example embodiment, the same elements as described in the aforementioned example embodiment will be indicated by the same reference numerals or the same reference designators. For the purpose of ease and convenience in explanation, the descriptions to the same elements as in the above example embodiment will be omitted or mentioned briefly. That is, differences between the present example embodiment and the first example embodiment will be mainly described hereinafter.

Referring to FIGS. 11A, 11B, and 11C, dielectric patterns 120 filling first preliminary holes 115 may be arranged in a first direction and a second direction perpendicular to the first direction to constitute a plurality of rows in the first direction and a plurality of columns in the second direction. In the present example embodiment, the dielectric patterns 120 constituting each of the columns may be arranged in a line. Differently from the example embodiment described with reference to FIGS. 1A to 10C, the dielectric patterns 120 according to the present example embodiment may be arranged in a matrix in the first and second directions. The first and second directions may correspond to an x-axis direction and a y-axis direction of FIG. 11A.

As described with reference to FIGS. 1A to 10C, the barrier layer 130 and the sacrificial layer 140 may be sequentially formed on the dielectric patterns 120 and then the etch control patterns 155 may be formed between dielectric patterns 120. Second preliminary holes 116 may be formed between the dielectric patterns 120. Because the dielectric patterns 120 are arranged in the first and second directions, each of the second preliminary holes 116 may be formed in a region defined by four dielectric patterns 120 and four etch control patterns 155 between the four dielectric patterns 120. The sacrificial layer 140 may be selectively etched using the barrier layer 130 and the etch control patterns 155 as masks to form the second preliminary holes 116. As described above, sizes and positions of the second preliminary holes 116 may be controlled by the etch control patterns 155 and the barrier layer 130. In the present example embodiment, the second preliminary hole 116 may be controlled by the four etch control patterns 155, such that the size and position of the second preliminary hole 116 may be more accurately controlled.

Referring to FIGS. 12A, 12B, and 12C, as mentioned above, the etch control patterns 155, the sacrificial layer 140, the barrier layer 130, and the dielectric patterns 120 may be removed to form the first and second preliminary holes 115 and 116 exposing the etch target layer 100 and then the exposed etch target layer 100 may be etched to form first and second contact holes 105 and 106. The first and second contact holes 105 and 106 according to the present example embodiment may be arranged in zigzag form. According to the present example embodiment, the second contact holes 106 may be formed in the etch target layer 100 along with the first contact holes 105 defined by the selective etching process, and a distance between the second contact holes 106 may be narrower than a distance between the first contact holes 105 realized by the selective etching process. As a result, integration degree of the semiconductor device may be improved.

According to some example embodiments, the second contact holes may be formed in the etch target layer together with the first contact holes. The distance between the second contact holes may be smaller than the distance between the first contact holes defined by the selective etching process. Thus, the integration degree of the semiconductor device may be improved. While the sacrificial layer is etched to form the second preliminary holes, the sizes and the positions of the second preliminary holes may be controlled by the etch control patterns and the barrier layer having the etch selectivity with respect to the sacrificial layer. Thus, a higher reliability semiconductor device may be realized.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device, comprising:
    forming first preliminary holes over an etch target layer, the first preliminary holes arranged as a plurality of rows in a first direction;
    forming dielectric patterns each filling one of the first preliminary holes;
    sequentially forming a barrier layer and a sacrificial layer on the dielectric patterns;
    forming etch control patterns between the dielectric patterns;
    forming second preliminary holes by etching the sacrificial layer, each of the second preliminary holes being in a region defined by at least three dielectric patterns adjacent to each other; and
    etching portions of the etch target layer corresponding to positions of the first and second preliminary holes to form contact holes.

2. The method of claim 1, wherein the forming first preliminary holes includes,
    arranging the first preliminary holes as a plurality of columns in a second direction, the second direction being perpendicular to the first direction; and
    arranging the first preliminary holes in each of the columns in a zigzag pattern in the second direction.

3. The method of claim 2, wherein the forming second preliminary holes includes forming each of the second preliminary holes in a region defined by the at least three dielectric patterns and at least three etch control patterns between the at least three dielectric patterns.

4. The method of claim 1, wherein the forming first preliminary holes includes,
  arranging the first preliminary holes as a plurality of columns in a second direction, the second direction being perpendicular to the first direction, and
  arranging the first preliminary holes in each of the columns in a line.

5. The method of claim 4, wherein the forming the second preliminary holes includes forming each of the second preliminary holes in a region defined by at least four dielectric patterns adjacent to each other and at least four etch control patterns between the at least four dielectric patterns.

6. The method of claim 4, further comprising:
  selectively removing the sacrificial layer, the barrier layer, the etch control patterns, an exposed portion of the etch stop layer, and the dielectric patterns, after the forming second preliminary holes.

7. The method of claim 6, wherein the selectively removing of the etch control patterns and the exposed portion of the etch stop layer is performed simultaneously.

8. The method of claim 1, wherein the forming first preliminary holes comprises,
  sequentially forming an etch stop layer and a mask layer on the etch target layer; and
  patterning the mask layer and the etch stop layer so as to expose the etch target layer.

9. The method of claim 8, wherein the forming dielectric patterns comprises,
  forming a dielectric layer filling the first preliminary holes;
  planarizing the dielectric layer to form the dielectric patterns spaced apart from each other; and
  removing the mask layer.

10. The method of claim 8, wherein the etch control patterns are formed of a same material as the etch stop layer.

11. The method of claim 1, wherein the sequentially forming a barrier layer and the sacrificial layer comprises forming the sacrificial layer such that an empty space is between the at least three dielectric patterns adjacent to each other.

12. The method of claim 1, wherein the forming etch control patterns comprises,
  conformally forming an etch control layer on the sacrificial layer; and
  partially removing the etch control layer such that a portion of the etch control layer remains between the at least three dielectric patterns.

13. The method of claim 1, wherein the forming second preliminary holes includes etching the sacrificial layer such that a portion of the sacrificial layer between the barrier layer and the etch control patterns remains between the at least three dielectric patterns.

14. The method of claim 1, wherein the forming second preliminary holes includes forming the second preliminary holes each having a size and a position defined by the at least three dielectric patterns and at least three etch control patterns between the at least three dielectric patterns.

15. The method of claim 1, wherein the forming a barrier layer and the forming etch control patterns includes forming the barrier layer and the etch control patterns, respectively, of a material having an etch selectivity with respect to the sacrificial layer.

16. The method of claim 1, wherein the forming etch control patterns includes using silicon nitride.

17. A method of forming a semiconductor device, comprising:
  forming first preliminary holes over an etch target layer, the first preliminary holes arranged as a plurality of rows in a first direction;
  forming dielectric patterns each filling one of the first preliminary holes;
  sequentially forming a barrier layer and a sacrificial layer on the dielectric patterns;
  forming second preliminary holes by etching the sacrificial layer, each of the second preliminary holes being in a region defined by at least three dielectric patterns adjacent to each other; and
  selectively etching portions of the etch target layer corresponding to positions of the first preliminary holes and the second preliminary holes to form first contact holes and second contact holes, respectively,
  wherein a distance between the second contact holes adjacent to each other is less than a distance between the first contact holes adjacent to each other.

18. The method of claim 17, further comprising:
  forming etch control patterns between the dielectric patterns,
  the second preliminary holes each having a size and position determined by at least one of the etch control patterns, and
  at least one of the sacrificial layer and the etch control patterns having an etch selectivity with respect to the barrier layer.

19. A method of forming a semiconductor device, comprising:
  forming first preliminary holes over an etch target layer, the first preliminary holes arranged as a plurality of rows in a first direction;
  forming dielectric patterns each filling one of the first preliminary holes;
  sequentially forming a barrier layer and a sacrificial layer on the dielectric patterns;
  forming etch control patterns between the dielectric patterns, at least one of the sacrificial layer and the etch control patterns having an etch selectivity with respect to the barrier layer;
  forming second preliminary holes between the dielectric patterns by partially etching the sacrificial layer, the second preliminary holes each having a size and position determined by at least one of the etch control patterns; and
  etching portions of the etch target layer corresponding to positions of the first and second preliminary holes to form first and second contact holes, respectively.

20. The method of claim 19, wherein the etching forms the first contact holes and the second contact holes such that a distance between the second contact holes adjacent to each other is less than a distance between the first contact holes adjacent to each other.

* * * * *